United States Patent

Diepers et al.

[11] 4,052,784
[45] Oct. 11, 1977

[54] METHOD FOR THE MANUFACTURE OF A TUBULAR CONDUCTOR SUITABLE FOR SUPERCONDUCTING CABLES

[75] Inventors: Heinrich Diepers, Erlangen-Bruck; Otto Schmidt; Horst Müsebeck, both of Erlangen, all of Germany

[73] Assignee: Siemens Aktiengesellschaft, Berlin and Munich, Germany

[21] Appl. No.: 446,096

[22] Filed: Feb. 26, 1974

[30] Foreign Application Priority Data

Mar. 9, 1973   Germany ............................ 2311835

[51] Int. Cl.$^2$ ...................... H01L 39/14; B21C 23/24
[52] U.S. Cl. .......................................... 29/599; 72/47
[58] Field of Search ............... 29/599, 424, 191.6, 29/199; 72/41, 42, 47, 274, 283, 700; 204/39, 64 R; 427/62; 174/15 CA

[56] References Cited

U.S. PATENT DOCUMENTS

| | | | |
|---|---|---|---|
| 1,072,478 | 9/1913 | Lutz | 72/47 |
| 2,268,617 | 1/1942 | Pierce | 72/47 |
| 3,342,648 | 9/1967 | Zucker et al. | 29/424 |
| 3,350,907 | 11/1967 | McDonald et al. | 72/38 |
| 3,353,387 | 11/1967 | Johnston | 72/46 |
| 3,580,019 | 5/1971 | Beresnev et al. | 72/47 |
| 3,623,221 | 11/1971 | Morton et al. | 29/599 |
| 3,644,987 | 2/1972 | Scheffler et al. | 29/599 |
| 3,655,349 | 4/1972 | Shah et al. | 72/42 X |
| 3,775,840 | 12/1973 | Diepers et al. | 29/599 |
| 3,777,368 | 12/1973 | Pfister et al. | 29/599 |
| 3,783,503 | 1/1974 | Diepers et al. | 29/599 |

FOREIGN PATENT DOCUMENTS

| | | | |
|---|---|---|---|
| 573,902 | 4/1933 | Germany | 72/700 |
| 194,211 | 2/1965 | Sweden | 72/274 |

OTHER PUBLICATIONS

Graeme-Barber et al., Tubular Niobium/Copper Conductors for AC Superconductive Power Transmission, Cryogenics, vol. 12, No. 4, Aug. 1972, pp.317-318.

*Primary Examiner*—E. M. Combs
*Attorney, Agent, or Firm*—Kenyon & Kenyon, Reilly, Carr & Chapin

[57] ABSTRACT

An improved method of manufacturing a tubular conductor which consist of a niobium layer and a copper layer, in which one side of a tube of electrolytic copper is plated with niobium by fusion electrolysis and the tube section thus produced, then drawn in several cold drawing passes to reduce the outside diameter and the wall thickness of the tube to form a longer tube, resulting in simplified production of seamless tubes, particularly useful in superconducting cables and having good mechanical, thermal and electrical contact between the niobium and copper layers.

20 Claims, 3 Drawing Figures

METHOD FOR THE MANUFACTURE OF A TUBULAR CONDUCTOR SUITABLE FOR SUPERCONDUCTING CABLES

BACKGROUND OF THE INVENTION

This invention relates to the production of tubular conductors which consist of a niobium layer and a copper layer, and more particularly, to an improved method for making such conductors, which conductors are particularly useful in superconducting cables.

It is well known that niobium is eminently suitable as a superconductor material for superconducting cables which are used for transmitting large amounts of electrical energy. In particular, its application for superconducting single- and three-phase cables is known. Niobium has a very high lower critical magnetic field $H_{C1}$ of about 120,000 A/m and relatively low a-c losses as long as this critical magnetic field is not exceeded. In superconducting cables, niobium can be used to advantage in the form of a thin layer applied to a tubular carrier of a metal such as copper, which at the temperature required for maintaining superconductivity of the niobium, i.e., about 4 to 5 K, is electrically highly normal-conducting and has a high thermal conductivity. For superconducting single- or three-phase a-c cables, a coaxial arrangement of such copper tubes, each provided with a niobium layer externally or internally would seem to be particularly advantageous. Preferably, a niobium layer is provided on the outside of the inner tube and on the inside of the outer tube of a pair of coaxial conductors. By using the inner tube as the outgoing conductor and the outer tube as the return conductor, electric and magnetic fields will be maintained only in the space between the niobium layers with the copper tubes remaining free of fields, so that no eddy current losses will occur therein. In the operation of such cables, a cooling medium such as liquid helium, will be supplied so that it flows along, particularly within the tubular inner conductor and over the outside of the tubular outer conductor. In this manner, the cooling medium is in direct contact with the copper surface of each tube (see "Elektrotechnische Zeitschrift — Edition A," Vol. 92 (1971), p. 740 to 745.)

In tubular conductors of this nature having a niobium and a copper layer, the copper is used for electrical stabilization of the superconducting niobium in that, if the niobium changes over from superconducting to the electrically normal-conducting state, which can occur in the event of an overload, the copper is capable of carrying at least part of the current flowing in the superconducting niobium, and of transferring to the contiguous cooling medium the heat loss produced in the niobium or resulting from a-c losses. For this stabilization to be effective, the best possible electrical and thermal contact between the niobium layer and the copper is necessary. Additionally in such cables, the surface of the niobium layer should be as smooth and free of disturbances as possible, since the a-c losses occuring in the niobium in the superconducting state increase relatively steeply with increasing surface roughness of the niobium. Because when operating below the critical field intensity $H_{C1}$, the current flowing in the superconducting niobium layer flows only in a thin surface layer, which is generally less than about 0.1 $\mu$m, the niobium layer can be made relatively thin, for example, with a thickness of between about 0.1 and 0.01 mm. By doing so, a large savings of expensive material is obtained.

The manufacture of tubular conductors of this type which have a niobium and a copper layer, involves great difficulties, since a good electrical and thermal contact between niobium and copper is very difficult to obtain and furthermore, because the mechanical union between niobium and copper breaks easily, for example, in the event of deformation causing the niobium layer to chip off the copper layer. The good surface quality is referred to above, in order to keep a-c losses at a minimum, also are difficult to obtain.

A method of depositing relatively pure and well-adhering niobium layers on a suitable carrier such as copper has been disclosed in an article by Mellors and Senderoff in "Journal of the Electrochemical Society," Vol. 112 (1965) p. 266 to 272. In the method disclosed therein, the niobium layer is deposited by fusion electrolysis from a melt consisting mainly of alkali fluorides and a niobium fluoride. However, the application of this method for the deposition of niobium onto copper tubes of great length such as those required for cables in order to avoid unnecessary welded joints, involves great difficulties. The tubes to be plated would have to be introduced into a molten electrolyte having a temperature of at least approximately 740° C through a vacuum-tight air lock. Furthermore, in a fusion-electrolysis plating process, the application of a niobium layer to the inside of a long copper tube would involve additional problems because of insufficient accessibility.

A method of manufacturing tubular conductors having a niobium layer and a copper layer has been disclosed in U.S. Pat. No. 3,777,368 granted Dec. 11, 1973 and assigned to the same assignee as the present invention. In the method disclosed therein, a strip consisting of a niobium layer and a copper layer, and having niobium flanges at its edges is first produced, then bent to form a tube with the niobium flanges abutting and the niobium flanges then joined together by electron beam welding. While this method, which furnishes a tube having a welded seam is suitable for producing tubes for superconducting cables having a niobium and a copper layer, it is still relatively costly, particularly because of the bending and welding operations required.

Thus, it can be seen that there is a need for an improved and simplified method of manufacturing tubular conductors of this nature which consist of a niobium and copper layer, and in particular, such a method which permits manufacturing seamless tubes having good contact between the niobium and copper layers.

SUMMARY OF THE INVENTION

The present invention provides such a method in which one side of the tube, i.e., the inner or outer side of electrolytic copper is plated with niobium using the fusion electrolysis method and a tube section so produced, which then consists of a niobium layer and a copper layer, then drawn in several cold drawing passes to reduce the outside diameter and the wall thickness of the tube to form a longer tube.

Through the use of electrolytic copper as the carrier for the niobium layer deposited by fusion electrolysis and through the subsequent cold drawing, an excellent thermal, electrical and mechanical bond between the niobium and the copper is obtained. This bond is preserved even during the relatively strong deformations that occur in cold drawing. In drawing experiments with tubes of ordinary copper, on which a niobium layer had been deposited by fusion electrolysis, a useful tube was unobtainable because the niobium consistently chipped off the copper during drawing. Only with electrolytic copper was the excellent thermal, electrical and mechanical bond obtained. By electrolytic copper, what is meant, for purposes of the present invention, is the type of copper commerically available under this designation, which copper is electrolytically refined by repeated electrolysis or the like, and which preferably also has a low oxygen content and can thus be termed low-oxygen copper. The residual resistance ratio of such copper grades suitable for the method of the present invention, i.e., the ratio of resistivity of the copper at room temperature to its resistivity of a temperature of 4.2 K is, in the absence of an external magnetic field, usually at least about 400, and preferably about 800 or more.

To avoid too great a stress on the niobium layer and on the bond between the two metals obtained during the deposition by fusion electrolysis, the wall thickness of the tube is reduced during the drawing process, preferably by no more than 20% per pass. In the interest of avoiding excessive material stresses on one hand, and still obtaining expedient manufacturing on the other hand, it is particularly advantageous to reduce the wall thickness of the tube by approximately 10% per pass.

By depositing the niobium layer on the copper tube, a tube section can be produced, in which the niobium layer is on the outside, as well as one in which the niobium layer is on the inside. In each case, the deposited niobium layer can be smoothed prior to the drawing, particularly through the use of a finishing operation on the lathe.

In practicing the method of the present invention, a drawing aid is needed during the drawing process. Its purpose, in particular, is to avoid excessive stress and heating of the metal due to the friction occuring, for example, at the dies. Excessive heating, particularly of the niobium layer, can lead to the absorption of atmospheric oxygen by the niobium layer and cause embrittlement of this layer.

For the copper side of the tube, ordinary drawing oil may be used as a drawing aid. However, on the niobium side of the tube, which should be as smooth and free of disturbances as possible to avoid a-c losses, a different drawing aid should be applied. Suitable drawing aids are, in particular, a lubricating layer of zapon varnish or lacquer or other fast-drying nitrocelluslose lacquers. When drawing relatively long tubes, care should be taken to insure proper cooling of the dies, so that the lacquer does not heat up. Another suitable drawing aid is a niobium pentoxide layer, formed on the surface of the niobium layer by anodic oxidation, for example, in a 25-% aqueous ammonia solution. Alternatively, a soap lubricant, such as zinc stearate can be applied as the drawing aid to the niobium side of the tube. Drawing oil may be used in addition to these drawing aids, which must be renewed after a few passes if necessary, due to stripping of the drawing aid.

The drawing of the tube consisting of a niobium and a copper layer over a round mandrel is particularly advantageous because of the great simplicity in this manufacturing process. The above described drawing aids, such as lacquers, niobium pentoxide layer or soap lubricant, need only be applied to the niobium layer if it is on the outside of the tube coming in contact with the die. If the niobium layer forms the inner cylindrical surface of the tube, only drawing oil need be used between the mandrel and the niobium layer. This is of great advantage since, as the tube becomes longer after several drawing passes, the internal niobium surface becomes less and less accessible for the application of drawing aids. On the other hand, if the tube is drawn, as is also possible, through the use of what is referred to as a floating or flying mandrel, the niobium layer must be supplied with one of the above described drawing aids even if it lies on the inside of the tube. In each instance, for the copper layer, drawing oil alone is sufficient regardless of whether it forms the inside or the outside of the tube. If the copper layer is on the inside and the drawing is performed over a round mandrel, it is advantageous to provide drawing oil between the copper layer and the mandrel. To carry out the plating of the copper tube with niobium using fusion electrolysis, the method of the above referenced article by Mellors and Senderoff can be used. A particularly suitable electrolyte is an eutectic mixture of sodium fluoride, potassium fluoride and lithium fluoride, in which potassium heptafluoride ($K_2NbF_7$) is dissolved. A specific electrolyte which may be used consists of 16.2% by weight $K_2NbF_7$, 26.2% by weight LiF, 10.4% by weight NaF and 47.2% by weight KF.

BRIEF DESCRIPTION OF THE PREFERRED EMBODIMENT

Figure 1:
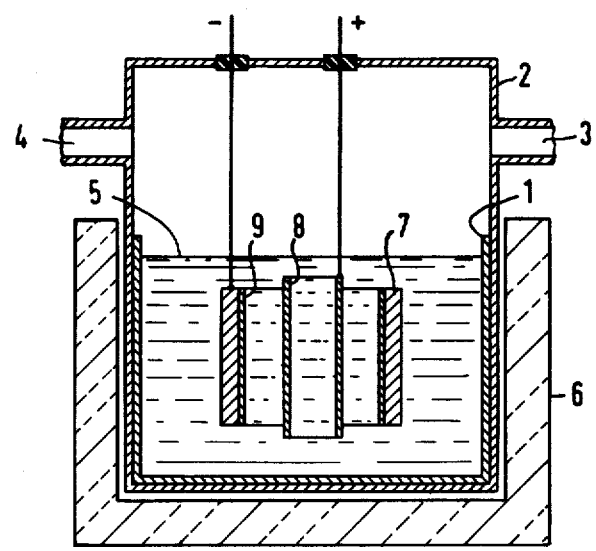
FIG. 1 is a schematic representation of an apparatus which may be used for carrying out the fusion electrolysis plating of a copper tube with niobium.

FIG. 1 shows in schematic form, an apparatus which may be used for the fusion-electrolysis plating of a copper tube with niobium. A plating chamber 2 has in its lower portion a vessel 1, preferably made of nickel, with the chamber 2 itself, made of alloy steel. Within the vessel 1 is contained the electrolyte 5 which, as noted above, will comprise a eutectic mixture of sodium fluoride, potassium fluoride and lithium fluoride, in which potassium heptafluoride has been dissolved. The plating chamber is evacuated through the pipe connections 3 and 4 and supplied with an inert gas such as argon. Thereafter, an electric resistance furnace 6 which surrounds the lower part of the plating chamber 2, is used to heat the electrolyte 5 to a temperature of about 740° C, causing it to melt. The tube 7 which is to be niobium-plated on the inside and which will preferably consist of electrolytic copper which has been electrolytically refined several times, is immersed in the molten electrolyte. Along with it, a coaxially disposed anode 8 consisting of a niobium tube is also immersed. Before immersion of the electrodes in the electrolyte, it is advantageous to carry out a predeposition of niobium on an auxiliary cathode in the manner described in detail in German Offenlegungsschrift No. 2,114,555. Furthermore, the copper tube 7 which is connected as the cathode may be surrounded by a fine mesh screen of material resistant to the molten electrolyte, such as fine mesh nickle gauze, with the anode 8 being arranged outside this screen. Through this last described measure which is described in detail in German Offenlegungsschrift No. 2,115,179, the quality of the deposited niobium layer can be improved.

A suitable current density for the deposition of the niobium layer is about 40 mA/cm$^2$ at the cathode. With this current density and using the above described electrolyte at an electrolyte temperature of about 740° C, a niobium layer of thickness of about 0.6 μm per minute can be deposited on the inside of the copper tube. Typically, for a copper tube having a wall thickness of about 20 mm, the deposition will be continued, until the deposited niobium layer has reached the thickness of about 2 mm. The thickness of the deposited layer will then be approximately 10% of the thickness of the copper tube 7. A tube section with these dimensions is particularly well suited as the starting tube for the subsequent drawing process. The copper tube can have, for example, an inside diameter of about 50 mm and a length of about 500 mm. After being plated with the niobium layer 9, the copper tube 7 is removed from the electrolyte, allowed to cool in a protective gas and then removed from the plating chamber 2 through an air lock, not shown specifically in FIG. 1. If prior to drawing, the niobium layer is to be given a lathe finish for smoothing, a layer somewhat thicker than 2 mm should be deposited in the plating operation, and this layer then reduced to a thickness of about 2 mm by turning.

If it is desired to produce a tube section in which the niobium layer is on the outside of the copper layer, the copper tube 7 will then be surrounded on the outside by the niobium anode 8 which will have, in that case, a larger diameter than the copper tube section 7. The process in all other respects is the same as that described above.

Figure 2:
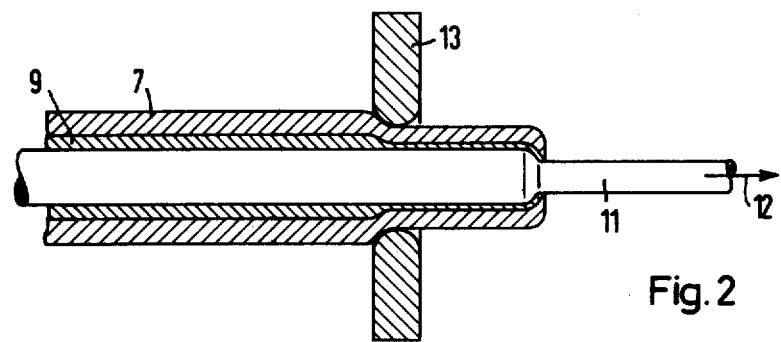
FIG. 2 is a crosssectional view showing the drawing of a tube with the niobium layer on the inside according to the present invention.

FIG. 2 illustrates the manner of cold-drawing a tube having niobium and copper layers with the niobium on the inside. As illustrated, the tube section with the niobium layer 9 and the copper layer 10 is placed on a round mandrel 11 made, for example, of hardened steel. The round mandrel is pulled in the direction of arrow 12 through a die 13 of hard metal or steel to form a tube of reduced diameter and reduced cross section. Drawing oil is applied as a drawing aid to the external copper cylindrical surface 7 of the tube section. In addition, the mandrel 11 is brushed with drawing oil before the tube section is slipped on, so that the oil also facilitates the sliding of the internal niobium layer 9 of the tube section on the mandrel during the drawing process. As noted above, the process comprises a plurality of cold-drawing passes such as that described above, in which the wall thickness of the tube and also its outside diameter are reduced. It is particularly advantageous, that the wall thickness reduction per pass be about 10%. The drawing is continued with changed dies 13 of increasingly smaller diameter until the wall thickness of the tube is reduced to about 5% of its original wall thickness. Drawing speed may be up to about 5m/min. After such processing, the niobium layer will be about 0.1 mm thick, and the copper layer about 1 mm thick. The length of the tube will have been stretched from its original length of 50 cm, to now be about 10 m long. The fully drawndown tube can then be stripped from the mandrel in conventional fashion by rolling-off, without breaking the firm bond between the niobium and the copper. The inside surface of the niobium, which has been pressed onto the very smooth surface of the mandrel 11 during the drawing, will also be very smooth in the finished tube and will exhibit very small a-c losses on the order of 0.5 μW/cm$^2$, for example, for a current of a frequency of 50 Hz.

Figure 3:
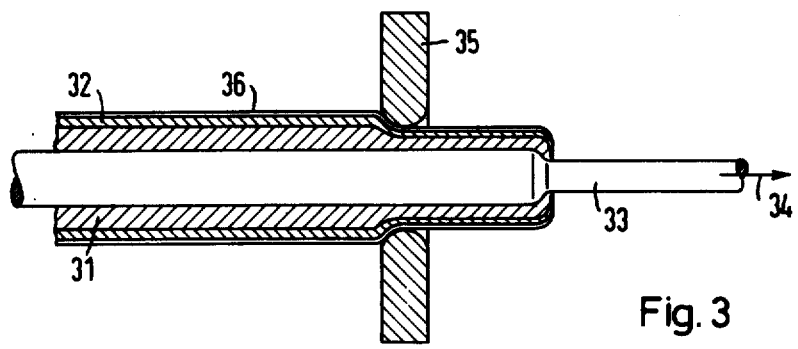
FIG. 3 is a similar view illustrating the drawing of a tube having the niobium layer on the outside.

FIG. 3 illustrates the drawing of a tube having a niobium layer 32 on the outside of a copper layer 31. In a manner similar to that described above, the tube is again placed on a round mandrel 33 and drawn through a die 35 with the aid of the mandrel with drawing being in the direction of arrow 34. Drawing oil as a drawing aid is applied to the mandrel 33 before the tube is slipped on so that the copper layer 31 can easily slide on the mandrel. The niobium layer 32 on the outside of the tube is covered with a drawing aid. This may be, for example, a film of zapon varnish. The tube section thus prepared is then drawn down in several drawing passes to form a longer tube. The cross section reduction in the individual drawing passes will be as described above in connection with FIG. 2. After every two drawing passes, the film of zapon varnish is stripped off the niobium surface 32, using acetone or the like and a new film applied. Drawing is continued until the wall thickness of the tube is about 10% of the original wall thickness. As noted above, drawing oil may also be applied to the outer surface of the niobium tube as a drawing aid in addition to the zapon varnish. As before, the drawing speed may be up to about 5 m/min.

As described above, the niobium layer 32 may alternatively be coated with a niobium pentoxide layer instead of the zapon varnish. Such layer may be obtained by anodic oxidation in a 25-% aqueous ammonia bath, for example. Such a layer is amorphous and relatively soft and imparts good lubricating properties to the niobium surface. After about two or three cold-drawing passes, the niobium pentoxide layer is dissolved in hydrofluoric acid and the niobium surface again oxidized. As with the zapon varnish, drawing oil may additionally be used during drawing.

Another suitable drawing aid is a suspension of zinc stearate in alcohol applied to the niobium cylinder surface prior to drawing. Although the processing method described above has been directed to reducing the wall thickness and outside diameter of the tube, the inside diameter of the tube may also be reduced, for example, by drawing over a flying or floating mandrel.

Thus, as described above, the method of the present invention allows the production of long tubes from relatively short tube sections. When installing a superconducting cable, the long tube sections can be transported to the installation site and assembled there. It should be noted that the tubes produced by the method of the present invention can also be used as tubular superconductors for other purposes and for superconducting cables, such as, feed lines for microwave energy to superconducting cavity resonators and the like, when the niobium layer is on the inside. These and other modifications may be made without departing from the spirit of the invention which is intended to be limited solely by the appended claims.

What is claimed is:

1. A method for manufacturing a tubular conductor consisting of a niobium layer and a copper layer, which conductor is particularly suited for a superconducting cable, comprising the steps of:
   a. plating one cylindrical surface of a seamless tube of electrolytic copper with a layer of niobium by fusion electrolysis;
   b. applying a lubricating coating to the niobium layer and copper surface;
   c. drawing the tube so formed in several cold drawing passes to reduce the outside diameter and the wall thickness of the tube and the niobium layer in order to form a longer tube.

2. The method according to claim 1 in which the wall thickness of the tube is reduced by no more than 20% per pass.

3. The method according to claim 2 wherein the wall thickness of the tube is reduced by approximately 10% per pass.

4. The method according to claim 1 and further including the step of smoothing the niobium layer by a turning operation prior to the coating and drawing steps.

5. The method according to claim 3 and further including the step of smoothing the niobium layer by a turning operation prior to the coating and drawing steps.

6. The method according to claim 1 wherein drawing oil is used as the lubricant coating on the copper side of the tube.

7. The method according to claim 3 wherein drawing oil is used as the lubricant coating on the copper side of the tube.

8. The method according to claim 1 wherein a layer of lacquer is applied to the niobium side of the tube as a lubricant coating.

9. The method according to claim 8 wherein said lacquer is a fast drying nitrocellulose lacquer.

10. The method according to claim 9 wherein said fast drying nitrocellulose lacquer is zapon varnish.

11. The method according to claim 1 and further including a step of forming a niobium pentoxide layer on the niobium side of the tube as a lubricant coating.

12. The method according to claim 6 and further including a step of forming a niobium pentoxide layer on the niobium side of the tube as a lubricant coating.

13. The method according to claim 1 and further including the step of applying a soapy lubricant to the niobium side of the tube prior to the drawing step.

14. The method according to claim 6 and further including the step of applying a soapy lubricant to the niobium side of the tube prior to the drawing step.

15. The method according to claim 14 wherein said soapy lubricant is zinc stearate.

16. The method according to claim 1 wherein said tube is drawn over a round mandrel.

17. The method according to claim 1 wherein the niobium layer forms the outer cylindrical surface of the tube.

18. The method according to claim 16 wherein the niobium layer forms the inner cylindrical surface of the tube and drawing oil is provided as a lubricant coating between the mandrel and the niobium layer.

19. The method according to claim 6 wherein the niobium layer forms the outer cylindrical surface of the tube.

20. A method according to claim 6 wherein said tube is drawn over a round mandrel and the niobium layer forms the inner cylindrical surface of the tube and drawing oil is provided as a lubricant coating between the mandrel and the niobium layer.

* * * * *